(12) United States Patent
Tamiya (10) Patent No.: US 8,229,975 B2
(45) Date of Patent: Jul. 24, 2012

(54) DATA COMPRESSION APPARATUS, DATA DECOMPRESSION APPARATUS, AND METHOD FOR COMPRESSING DATA

(75) Inventor: Keisuke Tamiya, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 292 days.

(21) Appl. No.: 12/270,766

(22) Filed: Nov. 13, 2008

(65) Prior Publication Data

US 2009/0132569 A1    May 21, 2009

(30) Foreign Application Priority Data

Nov. 15, 2007 (JP) ................................. 2007-297193

(51) Int. Cl.
*G06F 17/30* (2006.01)
*G06F 7/00* (2006.01)
(52) U.S. Cl. ....................................... 707/803; 707/795
(58) Field of Classification Search .................. 707/741, 707/999.101, E17.044, 795, 803
See application file for complete search history.

(56) References Cited

U.S. PATENT DOCUMENTS

| 5,835,912 | A  | * | 11/1998 | Pet ........................................ 1/1 |
| 5,970,490 | A  | * | 10/1999 | Morgenstern ......................... 1/1 |
| 7,284,196 | B2 | * | 10/2007 | Skeen et al. .................... 715/234 |
| 7,596,574 | B2 | * | 9/2009  | Sweeney ............................... 1/1 |
| 7,606,781 | B2 | * | 10/2009 | Sweeney et al. ................ 706/48 |
| 7,774,288 | B2 | * | 8/2010  | Acharya et al. ................ 706/45 |
| 7,822,788 | B2 | * | 10/2010 | Kanawa ......................... 707/811 |
| 7,849,090 | B2 | * | 12/2010 | Sweeney ....................... 707/741 |
| 2004/0143792 | A1 | * | 7/2004  | Demopoulos et al. ........ 715/513 |
| 2005/0114370 | A1 | * | 5/2005  | Lewak et al. .................. 707/100 |
| 2005/0185677 | A1 | * | 8/2005  | Christoffersson et al. .... 370/521 |
| 2005/0278139 | A1 |   | 12/2005 | Glaenzer |
| 2006/0059187 | A1 |   | 3/2006  | Brown |
| 2007/0271265 | A1 | * | 11/2007 | Acharya et al. .................... 707/6 |
| 2007/0271266 | A1 | * | 11/2007 | Acharya et al. .................... 707/6 |
| 2007/0271287 | A1 | * | 11/2007 | Acharya et al. ............... 707/101 |

(Continued)

FOREIGN PATENT DOCUMENTS

EP    896284 A1    2/1999

(Continued)

OTHER PUBLICATIONS

Qin, Jian, et al., "Vocabulary Use in XML Standards in the Financial Markets", Knowledge and Information Systems, vol. 6, Springer-Verlag London Ltd., © 2004, pp. 269-289.*

(Continued)

*Primary Examiner* — Robert Stevens
(74) *Attorney, Agent, or Firm* — Canon USA, Inc., IP Division (57) ABSTRACT

A data compression apparatus for compressing structured data is provided. The data compression apparatus includes an input unit configured to input a plurality of structured data items to be compressed and a plurality of schema files each corresponding to one of the structured data items, an index data generating unit configured to derive a common vocabulary set from a combination of at least two of the schema files among the input schema files and generate index data for associating an index with each of vocabulary items included in the common vocabulary set, and a replacement unit configured to replace the vocabulary included in the structured data item with a corresponding index on the basis of the index data for each of the structured data items corresponding to the schema files included in the combination of schema files.

7 Claims, 12 Drawing Sheets

U.S. PATENT DOCUMENTS

2007/0294289 A1* 12/2007 Farrell .................. 707/103 R
2008/0082526 A1* 4/2008 Kanawa ...................... 707/5

FOREIGN PATENT DOCUMENTS

JP      2005-215951 A    8/2005
WO      02/063775 A2     8/2002

OTHER PUBLICATIONS

Sumita, Eiichiro, et al., "Using the Web to Disambiguate Acronyms", Proc. of the Human Language Technology Conf. of the North American Chapter of the ACL, Association for Computing Linguistics, New York, NY, Jun. 2006, pp. 161-164.*

Hoshino, Ayako, et al., "A Framework for Automatic Generation of Grammar and Vocabulary Questions", WorldCALL 2008, Fukuoka, JP, Aug. 8, 2008, 31 pages.*

Guth, Susanne, "Rights Expression Languages", Digital Rights Managements, LNCS 2770, Springer-Verlag, Berlin, Germany, © 2003, pp. 101-112.*

Kim, Hyun Hee, "ONTOWEB: Implementing an Ontology-Based Web Retrieval System", Journal of the American Society for Information Science and Technology, vol. 56, No. 11, © 2005, pp. 1167-1176.*

Garcia-Remesal, M., et al., "ARMEDA II: Supporting Genomic Medicine through the Integration of Medical and Genetic Databases", BIBE 2004, IEEE Computer Society, © 2004, pp. 227-234.*

Millard, Keiran, et al., "Using XML Technology for Marine Data Exchange: A Position Paper of the MarineXML Initiative", © 2005, pp. 1-12.*

Helmer, Sven, "Measuring the Structural Similarity of Semistructured Documents Using Entropy", VLDB '07, Vienna, Austria, Sep. 23-28, 2007, pp. 1022-1032.*

Chaudhuri, Surajit, et al., "Robust and Efficient Match for Online Data Cleaning", SIGMOD 2003, San Diego, CA, Jun. 9-12, 2003, pp. 313-324.*

Natchetoi et al., "EXEM: Efficient XML Data Exchange Management for Mobile Applications," Information Systems Frontiers Journal, vol. 9, No. 4, Jul. 18, 2007, pp. 439-448, Springer Science + Business Media, LLC.

* cited by examiner

FIG. 2A booklist1.rng

```
<grammar xmlns="http://relaxng.org/ns/structure/1.0">
<start>
<element name="list" ns="http://example.org/booklist/1.0">
<zeroOrMore>
<element name="book">
<element name="isbn"><text/></element>
<element name="name"><text/></element>
<element name="price"><text/></element>
<element name="stock"><text/></element>
</element>
</zeroOrMore>
</element>
</start>
</grammar>
```

FIG. 2B booklist2.rng

```
<grammar xmlns="http://relaxng.org/ns/structure/1.0">
<start>
<element name="list" ns="http://example.org/booklist/2.0">
<oneOrMore>
<element name="book">
<element name="isbn"><text/></element>
<element name="name"><text/></element>
<element name="price"><text/></element>
<element name="stock"><text/></element>
<element name="writer"><text/></element>
</element>
</oneOrMore>
</element>
</start>
</grammar>
```

FIG. 2C addresslist1.rng

```
<grammar xmlns="http://relaxng.org/ns/structure/1.0">
<start>
<element name="list" ns="http://example.org/address/1.0">
<zeroOrMore>
<element name="entry">
<element name="name"><text/></element>
<element name="age"><text/></element>
<element name="tel"><text/></element>
<element name="address"><text/></element>
</element>
</zeroOrMore>
</element>
</start>
</grammar>
```

FIG. 2D adresslist2.rng

```
<grammar xmlns="http://relaxng.org/ns/structure/1.0">
<start>
<element name="list" ns="http://example.org/address/2.0">
<zeroOrMore>
<element name="entry">
<element name="name"><text/></element>
<element name="birthday"><text/></element>
<element name="tel"><text/></element>
<element name="address"><text/></element>
</element>
</zeroOrMore>
</element>
</start>
</grammar>
```

FIG. 3A booklist1.xml

```xml
<list xmlns="http://example.org/booklist/1.0">
  <book>
    <isbn>ISBN4-xxxxxx-xxx-x</isbn>
    <name>XML Tutorial</name>
    <price>5400</price>
    <stock>20</stock>
  </book>
  <book>
    <isbn>ISBN4-yyyyyy-yyy-y</isbn>
    <name>XSLT Guide Book</name>
    <price>1400</price>
    <stock>300</stock>
  </book>
  ...
</list>
```

FIG. 3B booklist2.xml

```xml
<list xmlns="http://example.org/booklist/2.0">
  <book>
    <isbn>ISBN4-xxxxxx-xxx-x</isbn>
    <name>XML Tutorial</name>
    <price>5400</price>
    <stock>20</stock>
    <writer>Murasaki Shikibu</writer>
  </book>
  <book>
    <isbn>ISBN4-yyyyyy-yyy-y</isbn>
    <name>XSLT Guide Book</name>
    <price>1400</price>
    <stock>300</stock>
    <writer>Seisho Nagon</writer>
  </book>
  ...
</list>
```

FIG. 3C addresslist1.xml

```xml
<list xmlns="http://example.org/addresslist/1.0">
  <entry>
    <name>Murasaki Shikibu</name>
    <age>26</age>
    <tel>xx-xxxx-xxxx</tel>
    <address>Kyoto</address>
  </entry>
  <entry>
    <name>Tokugawa Ieyasu</name>
    <age>42</age>
    <tel>yy-yyyy-yyyy</tel>
    <address>Tokyo</address>
  </entry>
  ...
</list>
```

FIG. 3D adresslist2.xml

```xml
<list xmlns="http://example.org/addresslist/2.0">
  <entry>
    <name>Murasaki Shikibu</name>
    <birthday>1980-10-25</birthday>
    <tel>xx-xxxx-xxxx</tel>
    <address>Kyoto</address>
  </entry>
  <entry>
    <name>Tokugawa Ieyasu</name>
    <birthday>1984-12-26</birthday>
    <tel>yy-yyyy-yyyy</tel>
    <address>Tokyo</address>
  </entry>
  ...
</list>
```

FIG. 4A

| VOCABULARY |
|---|
| list |
| book |
| isbn |
| name |
| price |
| stock |

FIG. 4B

| VOCABULARY |
|---|
| list |
| book |
| isbn |
| name |
| price |
| stock |
| writer |

FIG. 4C

| VOCABULARY |
|---|
| list |
| entry |
| name |
| age |
| tel |
| address |

FIG. 4D

| VOCABULARY |
|---|
| list |
| entry |
| name |
| birthday |
| tel |
| address |

FIG. 5A 00000001.idx

1, list
2, book
3, isbn
4, name
5, price
6, stock
7, writer

FIG. 5B 00000002.idx

1, list
2, entry
3, name
4, age
5, tel
6, address
7, birthday

FIG. 6

|  | booklist1.rng | booklist2.rng | addresslist1.rng | addresslist2.rng |
|---|---|---|---|---|
| booklist1.rng |  | 0.93 | 0.33 | 0.33 |
| booklist2.rng |  |  | 0.31 | 0.31 |
| addresslist1.rng |  |  |  | 0.71 |
| addresslist2.rng |  |  |  |  |

FIG. 7

| STRUCTURED DATA NAME | SCHEMA NAME |
|---|---|
| booklist1.xml | booklist1.rng |
| booklist2.xml | booklist2.rng |
| addresslist1.xml | addresslist1.rng |
| addresslist2.xml | addresslist2.rng |

FIG. 8A booklist1.comp

```
<#1 xmlns="http://example.org/booklist/1.0">
 <#2>
  <#3>ISBN4-xxxxxx-xxx-x</#3>
  <#4>XML Tutorial</#4>
  <#5>5400</#5>
  <#6>20</#6>
 </#2>
 <#2>
  <#3>ISBN4-yyyyy-yyy-y</#3>
  <#4>XSLT Guide Book</#4>
  <#5>1400</#5>
  <#6>300</#6>
 </#2>
 ...
</#1>
```

FIG. 8B booklist2.comp

```
<#1 xmlns="http://example.org/booklist/2.0">
 <#2>
  <#3>ISBN4-xxxxxx-xxx-x</#3>
  <#4>XML Tutorial</#4>
  <#5>5400</#5>
  <#6>20</#6>
  <#7>Murasaki Shikibu</#7>
 </#2>
 <#2>
  <#3>ISBN4-yyyyy-yyy-y</#3>
  <#4>XSLT Guide Book</#4>
  <#5>1400</#5>
  <#6>300</#6>
  <#7>Seisho Nagon</#7>
 </#2>
 ...
</#1>
```

FIG. 8C addresslist1.comp

```
<#1 xmlns="http://example.org/addresslist/1.0">
 <#2>
  <#3>Murasaki Shikibu</#3>
  <#4>26</#4>
  <#5>xx-xxx-xxxx</#5>
  <#6>Kyoto</#6>
 </#2>
 <#2>
  <#3>Tokugawa Ieyasu</#3>
  <#4>42</#4>
  <#5>yy-yyyy-yyyy</#5>
  <#6>Tokyo</#6>
 </#2>
 ...
</#1>
```

FIG. 8D addresslist2.comp

```
<#1 xmlns="http://example.org/addresslist/2.0">
 <#2>
  <#3>Murasaki Shikibu</#3>
  <#7>1980-10-25</#7>
  <#5>xx-xxxx-xxxx</#5>
  <#6>Kyoto</#6>
 </#2>
 <#2>
  <#3>Tokugawa Ieyasu</#3>
  <#7>1964-12-26</#7>
  <#5>yy-yyyy-yyyy</#5>
  <#6>Tokyo</#6>
 </#2>
 ...
</#1>
```

FIG. 9 booklist1.comp, 00000001.idx
booklist2.comp, 00000001.idx
addresslist1.comp, 00000002.idx
addresslist2.comp, 00000002.idx

| GROUP NUMBER | SCHEMA NAME |
|---|---|
| 00000001 | booklist1.rng, booklist2.rng |
| 00000002 | addresslist1.rng, addresslist2.rng |

DATA COMPRESSION APPARATUS, DATA DECOMPRESSION APPARATUS, AND METHOD FOR COMPRESSING DATA

BACKGROUND OF THE INVENTION

1. Field of the Invention

The present invention relates to a data compression apparatus, a data decompression apparatus, and a method for compressing data.

2. Description of the Related Art

XML (eXtensive Markup Language) defined by the Worldwide Web Consortium (W3C), which is a standardization organization, is widely used as a language for describing data exchanged over the Internet. Using XML, data is represented as a collection of parts, such as elements and attributes, and is represented as a structure. In addition, an XML schema is used as definition information about elements and attributes used in XML data. Examples of a language for describing an XML schema include an "XML Schema" defined by the W3C and a "Relax NG" defined by the International Organization for Standardization (ISO).

Data written in XML has a text format including elements and attributes written with character strings called "tags". In addition, a technique is proposed for compressing XML data so as to reduce the size of the XML data using a technology called "binary XML" (refer to, for example, Japanese Patent Laid-Open No. 2005-215951). In a binary XML technology, a character string, such as an element name and an attribute name, included in structured data is compressed by replacing the character string with a predetermined code using a conversion table. By using such a code, the information size of the character string can be reduced.

However, before data is compressed, a conversion table used for indexing element names and attribute names needs to be generated. In addition, such a conversion table needs to be generated for each type of structured data or each of languages defined by an XML schema, such as the SVG language. That is, in order to compress a plurality of different types of structured data, a conversion table is necessary for each of the types of structured data or each of the types of language used for describing the structured data.

Accordingly, when XML data describing, for example, device setting information, are acquired from a plurality of devices located in a network using, for example, a web service and are stored in a single apparatus, system resources, such as the capacities of a memory and a recording medium, may be wasted. That is, even when the schemas for the device setting information of a plurality of versions are almost the same, redundant conversion tables including the same vocabulary items need to be generated for the different versions.

SUMMARY OF THE INVENTION

The present invention provides a data compression apparatus, a data decompression apparatus, and a method for compressing data that are capable of efficiently compressing structured data.

According to an embodiment of the present invention, a method for compressing structured data is provided. The method includes the steps of: inputting a plurality of structured data items to be compressed and a plurality of schema files each corresponding to one of the structured data items, deriving a common vocabulary set from a combination of at least two schema files of the input schema files and generating index data for associating an index with each of vocabulary items included in the common vocabulary set, and replacing a vocabulary item included in each of the structured data items corresponding to the schema files included in the combination of schema files with a corresponding index using the index data.

Further features and aspects of the present invention will become apparent from the following description of exemplary embodiments with reference to the attached drawings.

DESCRIPTION OF THE EMBODIMENTS

Various embodiments of the present invention are described in detail below with reference to the accompanying drawings. However, these embodiments are only illustrative and not meant to be limiting the scope of the invention.

First Embodiment

A data compression apparatus according to a first embodiment of the present invention is described below. In the present embodiment, the data compression apparatus compresses structured data written in an XML format.

Configuration of Apparatus

Figure 1:
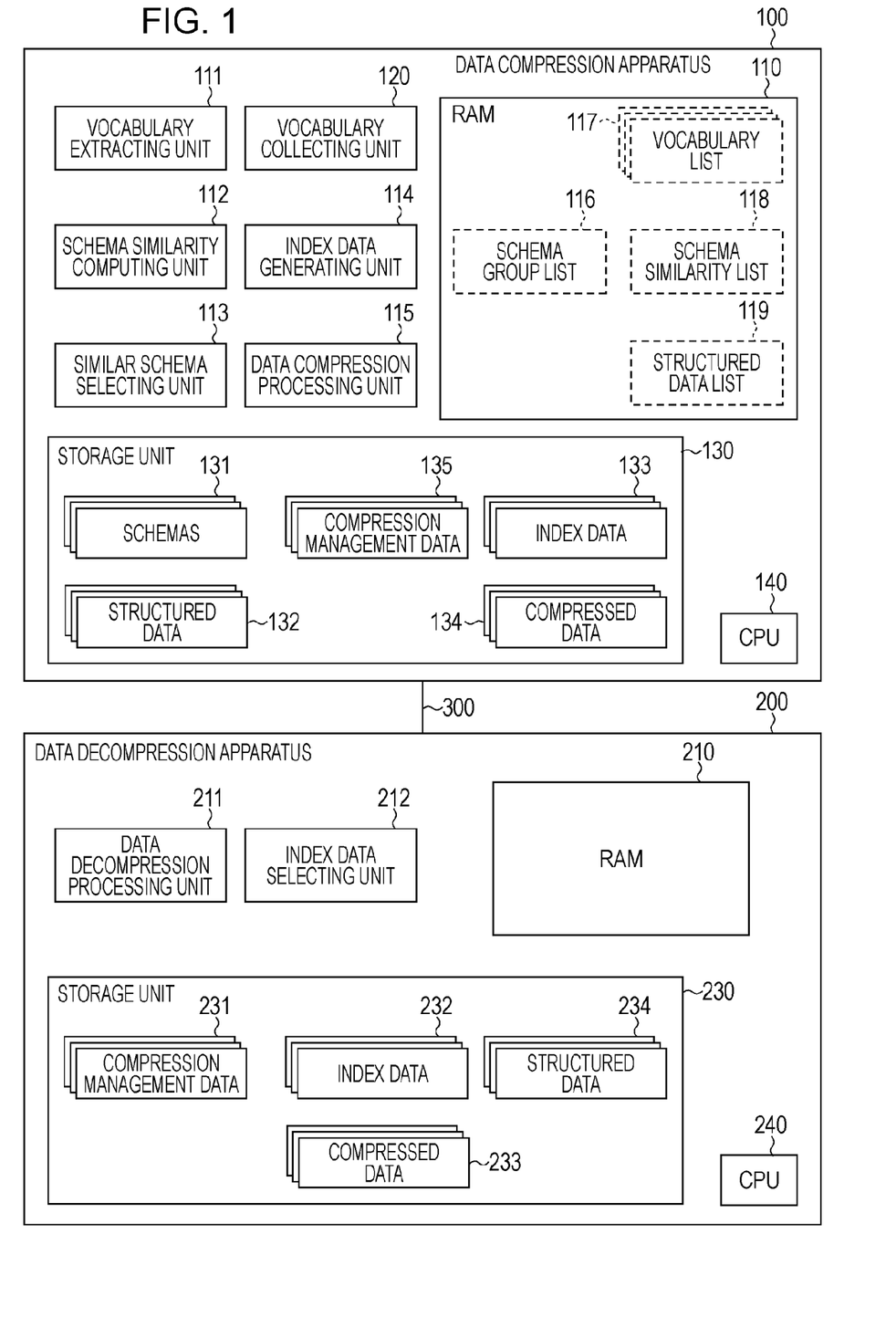
FIG. 1 illustrates an exemplary internal configuration of a data compression apparatus according to a first embodiment of the present invention.

FIG. 1 illustrates an exemplary internal configuration of the data compression apparatus according to the first embodiment. In addition, FIG. 1 illustrates a data decompression apparatus that decodes structured data compressed by the data compression apparatus into the original structured data.

A data compression apparatus 100 includes a random access memory (RAM) 110, a storage unit 130, and a central processing unit (CPU) 140. In addition, the data compression apparatus 100 includes the following units: a vocabulary extracting unit 111, a schema similarity computing unit 112, a similar schema selecting unit 113, a vocabulary collecting unit 120, an index data generating unit 114, and a data compression processing unit 115. These units are described in more detail below.

The storage unit 130 includes, for example, a hard disk drive (HDD). The storage unit 130 stores structured data 132 to be compressed and a schema (a schema file) 131 corresponding to the structured data 132. In addition, the storage unit 130 stores compression management data 135, index data 133, and compressed data (compressed structured data) 134, which are generated as a result of a compression process.

The vocabulary extracting unit 111 is a functional unit that extracts vocabulary items, such as an element name and an attribute name, from the schema file 131 and generates a vocabulary list 117 described below for each of the schemas.

The schema similarity computing unit 112 is a functional unit that computes the similarities between schemas on the basis of the vocabulary list 117 and registers the similarities in a schema similarity list 118. The similar schema selecting unit 113 is a functional unit that refers to the schema similarity list 118, which is described in more detail below, classifies similar schemas into a group, and registers the group into a schema group list 116. The index data generating unit 114 is a functional unit that refers to the schema group list 116 and the vocabulary list 117 so as to generate the index data 133 for each of the schema groups described below.

The data compression processing unit 115 is a functional unit that refers to the index data 133 so as to convert a vocabulary item contained in the structured data 132 to an index value. In addition, the data compression processing unit 115 has a function of identifying the index data 133 and writing the index data 133 into the compression management data 135.

The vocabulary collecting unit 120 is a functional unit that refers to the vocabulary list 117 so as to derive a union of sets of vocabulary items contained in each of the schemas.

A data decompression apparatus 200 includes a RAM 210, a storage unit 230, and a CPU 240. In addition, the data decompression apparatus 200 includes a data decompression processing unit 211 and an index data selecting unit 212, which are described below.

The data decompression processing unit 211 is a functional unit that refers to index data 232 and converts index values contained in compressed data 233 into vocabulary items so as to reconstruct structured data 234.

The index data selecting unit 212 is a functional unit that, when decompressing the compressed data 233, refers to compression management data 231 described below and identifies which one of the index data items 232 is to be used.

While the following description is made with reference to the separate data compression apparatus 100 and the data decompression apparatus 200, the data compression apparatus 100 and the data decompression apparatus 200 may be integrated into one apparatus body. For example, a program for compressing data and a program for decompressing data according to the present embodiment may be executed on a single personal computer (PC).

In addition, in this description, the data compression apparatus 100 and the data decompression apparatus 200 are configured so as to be capable of receiving and transmitting a variety of types of data via a network cable 300. However, the data compression apparatus 100 and the data decompression apparatus 200 may receive and transmit data using a recording medium, such as a hard disk or a compact disc read-only memory (CD-ROM).

Data Structure

FIGS. 2A to 2D illustrate examples of schemas written in a schema language Relax NG having a specification defined by the ISO (http://www.relaxng.org/spec-20011203.html). In this example, for a book list, two schemas "booklist1.rng" (see FIG. 2A) and "booklist2.rng" (see FIG. 2B) of different versions are shown. In addition, for an address list, two schemas "addresslist1.rng" (see FIG. 2C) and "addresslist2.rng" (see FIG. 2D) of different versions are shown.

FIGS. 3A to 3D illustrate examples of structured data written in an XML format having a specification defined by the W3C. Data "booklist1.xml" (see FIG. 3A) and "booklist2.xml" (see FIG. 3B) are structured data having the schemas "addresslist1.rng" and "addresslist2.rng", respectively.

Figure 7:
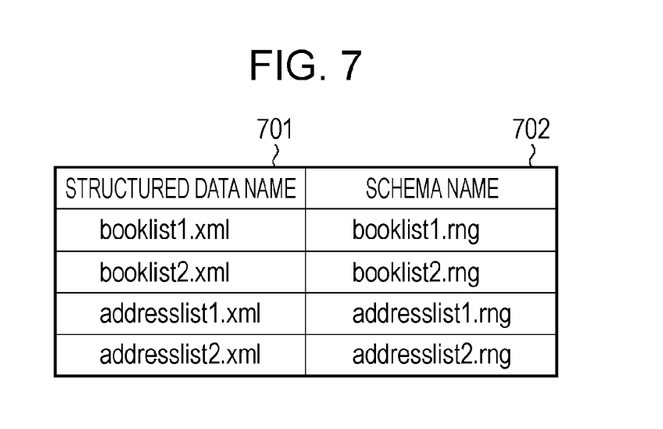
FIG. 7 illustrates an example of a structured data list for describing a relationship between a structured data item and a schema.

FIG. 7 illustrates an example of a structured data list for describing a relationship between a structured data item and a schema.

The structured data list contains, in a schema name entry 702 thereof, a file name of a schema to which the structured data item written in a structured data name entry 701 conforms. In the following descriptions, it is assumed that the structured data list is pre-registered by an operator or an application before data compression processing is performed. However, the structured data list may be automatically generated by referring to information about the location of a schema written in the structured data (e.g., the schemaLocation attribute of the W3C XML Schema) and a name space URI.

Operation of Apparatus (Data Compression Processing)

An exemplary procedure of data compressing processing performed by the data compression apparatus 100 according to the first embodiment is next described.

Figure 10:
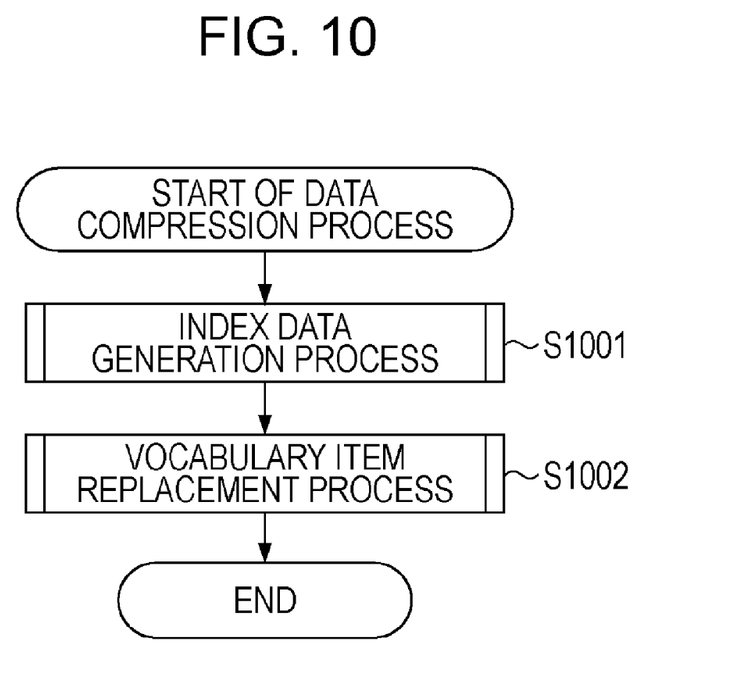
FIG. 10 is a flowchart of schematic data compression processing performed by a data compression apparatus.

FIG. 10 is a flowchart of schematic data compression processing performed by the data compression apparatus 100. The following steps are performed by the data compression apparatus 100 by controlling the above-described functional units.

In step S1001, the index data 133 is generated. The index data 133 defines a correspondence between a vocabulary item and an index value that is to be replaced with the vocabulary.

In step S1002, the index data 133 generated in step S1001 is referred to, and a vocabulary item, such as an element name or an attribute name, contained in the structured data 132 is converted into an index value. In this way, the compressed structured data 134 is generated.

Steps shown in FIG. 10 are described in detail below.

Figure 13:
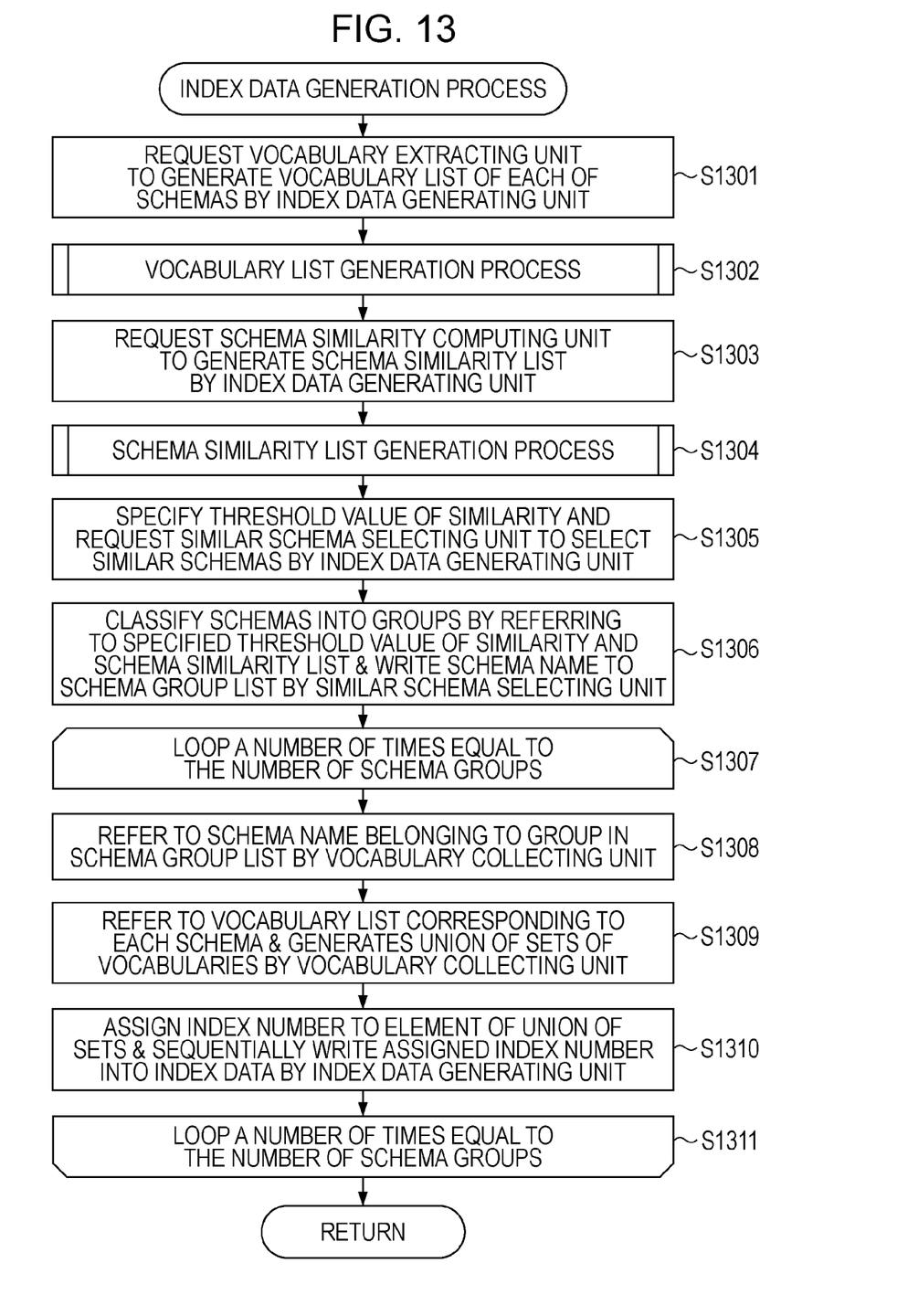
FIG. 13 is a detailed flowchart of an index data generation process.

FIG. 13 is a detailed flowchart of an index data generation process (S1001). The following process flow starts in response to, for example, a user input operation.

In step S1301, the index data generating unit 114 requests the vocabulary extracting unit 111 to generate the vocabulary list 117 of each of the schema files 131 that define the grammar of the structured data 132. That is, in this example, the index data generating unit 114 requests the vocabulary extracting unit 111 to generate a vocabulary list for each of the four schemas shown in FIG. 2.

In step S1302, the vocabulary extracting unit 111 performs a vocabulary list generation process described below so as to generate the vocabulary list 117 for each of the schemas.

FIGS. 4A to 4D illustrate examples of the vocabulary lists for the schemas. The vocabulary lists shown in FIGS. 4A to 4D correspond to the schemas shown in FIGS. 2A to 2D, respectively. The vocabulary lists contain vocabulary items (element names and attribute names) defined by the schemas.

In step S1303, the index data generating unit 114 requests the schema similarity computing unit 112 to generate the schema similarity list 118. That is, in this example, the index data generating unit 114 requests the schema similarity computing unit 112 to generate a list of the similarities between any two of the four schemas shown in FIGS. 2A to 2D.

In step S1304, the schema similarity computing unit 112 performs a schema similarity list generation process described below so as to derive the similarities between any two of the schemas. Subsequently, the schema similarity computing unit 112 generates the schema similarity list 118.

Figure 6:
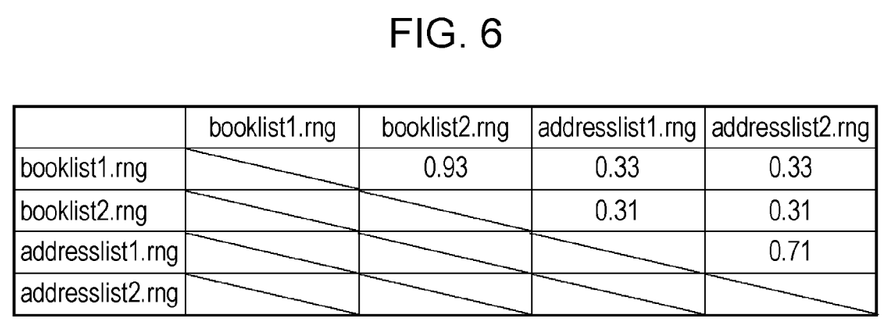
FIG. 6 illustrates an exemplary schema similarity list.

FIG. 6 illustrates an exemplary schema similarity list. The similarity between two schemas is registered in a field designated by a row having the name of one of the schemas and a column having the name of the other schema. In FIG. 6, the similarity ranges from 0 to 1. As the value increases, the similarity becomes higher.

In step S1305, the index data generating unit 114 requests the similar schema selecting unit 113 to determine whether the similarity is a predetermined value or higher (0.5, in this example) so as to classify the similar schemas into the same group.

In step S1306, the similar schema selecting unit 113 refers to the schema similarity list 118 and classifies the schemas. For example, when the schema similarity list 118 includes the values shown in FIG. 6, the schema similarity list 118 lists up combinations of the schemas having a threshold value of 0.5 or higher. Thereafter, the schema similarity list 118 sequentially selects combinations of schemas starting from the one having the highest similarity while deselecting a combination including the same schema so that one group is formed. Each of unselected schemas forms one group. In this example, a combination (booklist1.rng, booklist2.rng) having a similarity of 0.93 and a combination (addresslist1.rng, addresslist2.rng) having a similarity of 0.71 are selected as a group. Subsequently, the similar schema selecting unit 113 assigns a group number selected from numbers starting from "00000001" to an entry of the schema group list 116 and registers the schema names in the entry.

Figure 15:
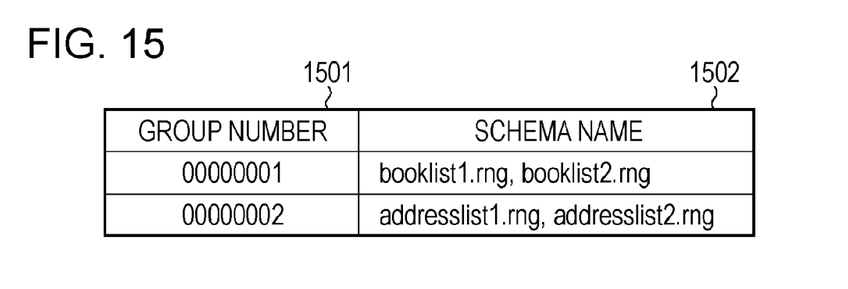
FIG. 15 illustrates an exemplary schema group list.

FIG. 15 illustrates an exemplary schema group list. The schema group list 116 includes a schema name entry 1502 registered for each group and a group number entry 1501 having a number selected from numbers starting from "00000001" assigned thereto.

Steps S1307 to S1311 are performed for each of the groups classified in step S1306.

In step S1308, the vocabulary collecting unit 120 refers to the schema name entry of the schema group list 116 and acquires a file name list of the schemas in the group.

In step S1309, the vocabulary collecting unit 120 refers to all of the vocabulary lists 117 corresponding to the schemas acquired in step S1308 using the file names of the schemas. The vocabulary collecting unit 120 then generates a union of the sets of vocabulary items. For example, since schemas corresponding to the group number "00000001" are "booklist1.rng" and "booklist2.rng", the union of the sets of vocabulary items registered in the corresponding vocabulary lists is {list, book, isbn, name, price, stock, writer}.

In step S1310, the index data generating unit 114 associates an index value with each of the elements in the union of the sets generated in step S1309. Numbers "#1", "#2", . . . may be used for the index values. The index data generating unit 114 then generates a mapping table indicating this association. This mapping table serves as the index data 133.

Figure 5A:
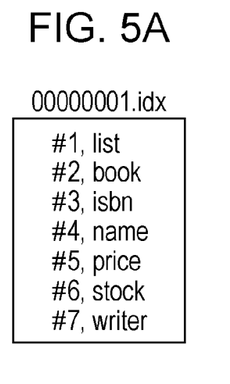
FIGS. 5A and 5B illustrate examples of index data.
Figure 5B:
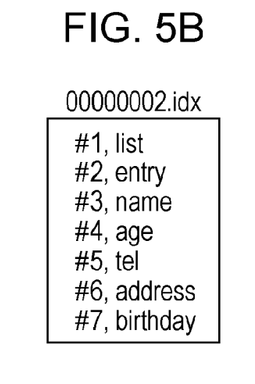

FIGS. 5A and 5B illustrate an example of the index data. The index data corresponding to the group number in the schema group list is named as a "group number" plus a file extension ("idx" in this example). More specifically, FIGS. 5A and 5B illustrate index data items corresponding to group numbers "00000001" and "00000002", respectively. In this example, a CSV format in which an index number (#1, #2, . . . ) and a vocabulary item are comma-separated is employed. However, any format, such as a binary data format, that can be used to define the correspondence between an index number and a vocabulary item may be employed.

Figure 11:
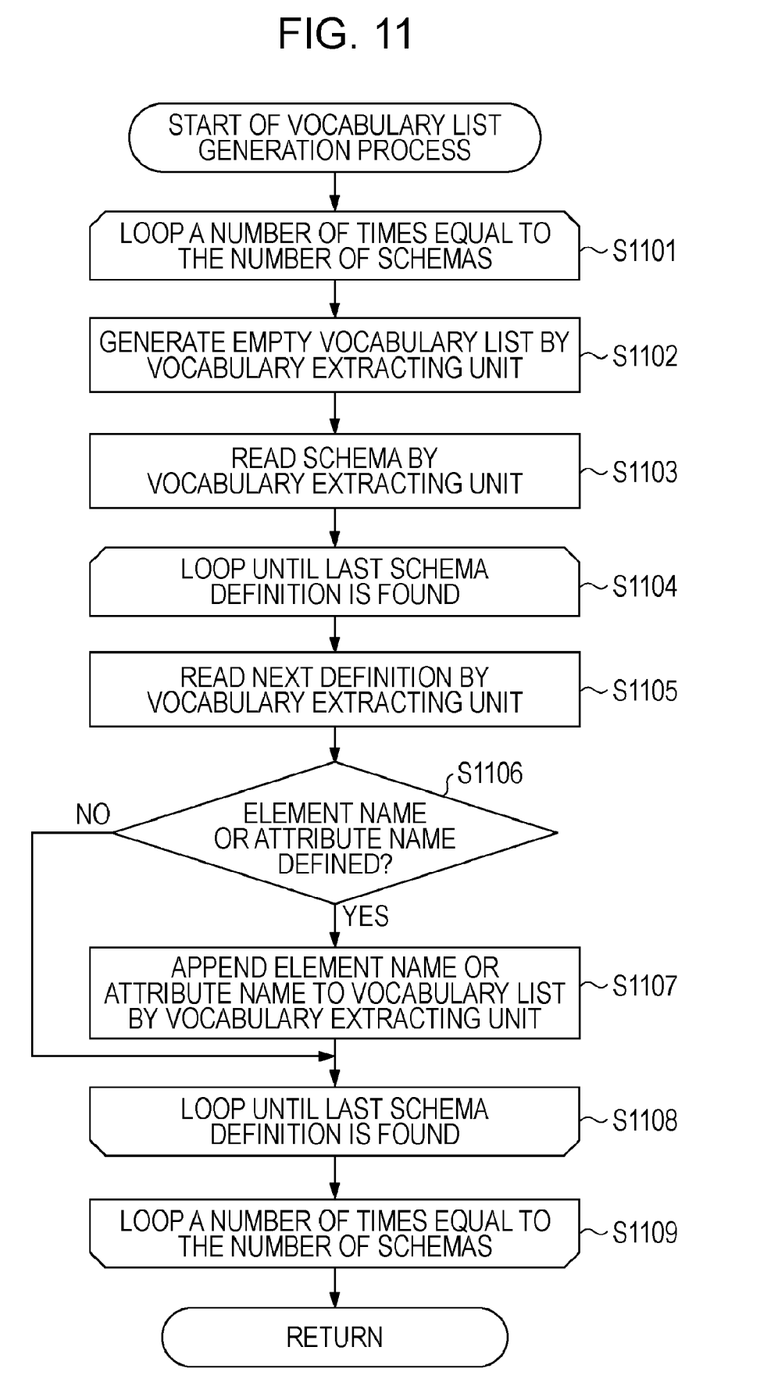
FIG. 11 is a detailed flowchart of a vocabulary list generation process.

FIG. 11 is a detailed flowchart of an exemplary vocabulary list generation process (S1302).

Upon receiving a request for generation of a vocabulary list, the vocabulary extracting unit 111 performs the following process for each of the schemas 131. That is, in this example, the performance of the following process is repeated four times for four schemas.

In step S1102, the vocabulary extracting unit 111 generates an empty vocabulary list 117.

In step S1103, the schema 131 is read (by an input unit), and the definitions of the schemas 131 are searched for from the top to the bottom (S1104 to S1108). If an element name or an attribute name is found, the name is appended to the vocabulary list 117 as a vocabulary item (S1105, S1106, and S1107).

Figure 2A:
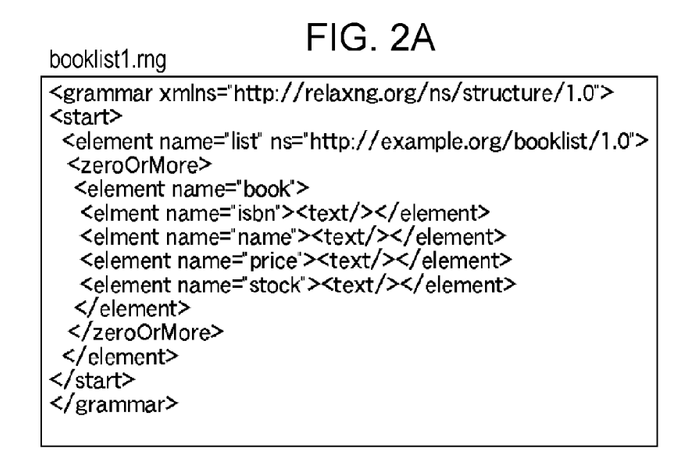
FIGS. 2A to 2D illustrate examples of schemas.
Figure 2B:
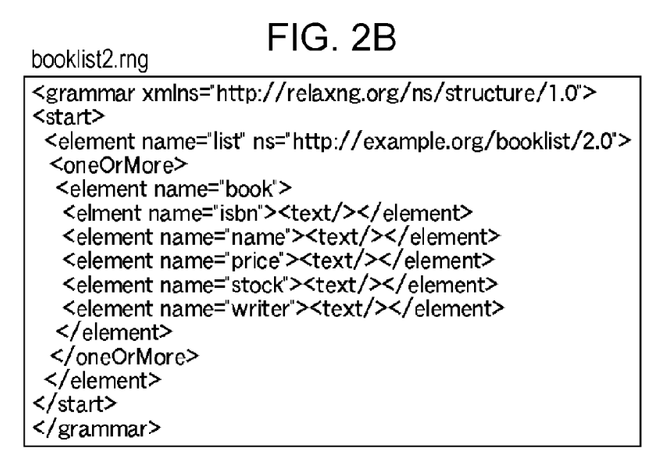
Figure 2C:
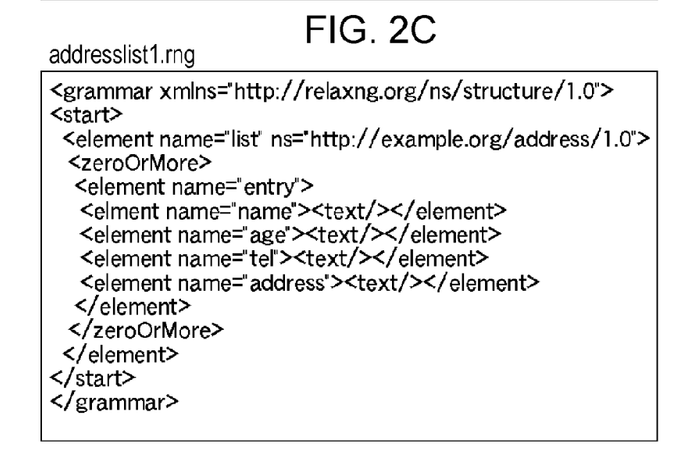
Figure 2D:
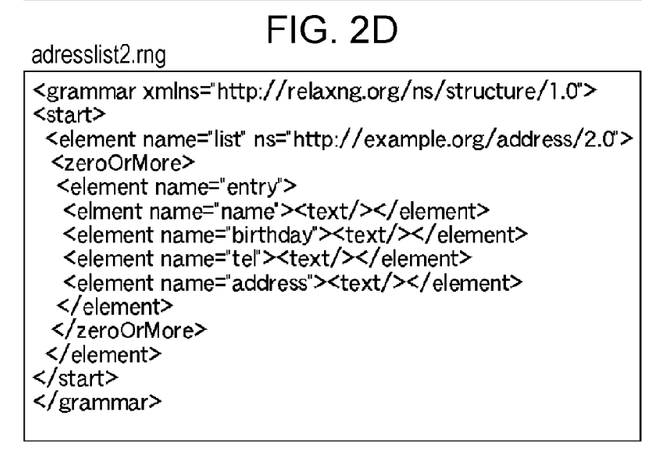

For example, for the schema shown in FIG. 2A, the values of a name (a name attribute) of the element definition (element "element") is sequentially extracted, and the extracted element names {list, book, isbn, name, price, stock} are registered as vocabulary items (a common vocabulary set).

Figure 12:
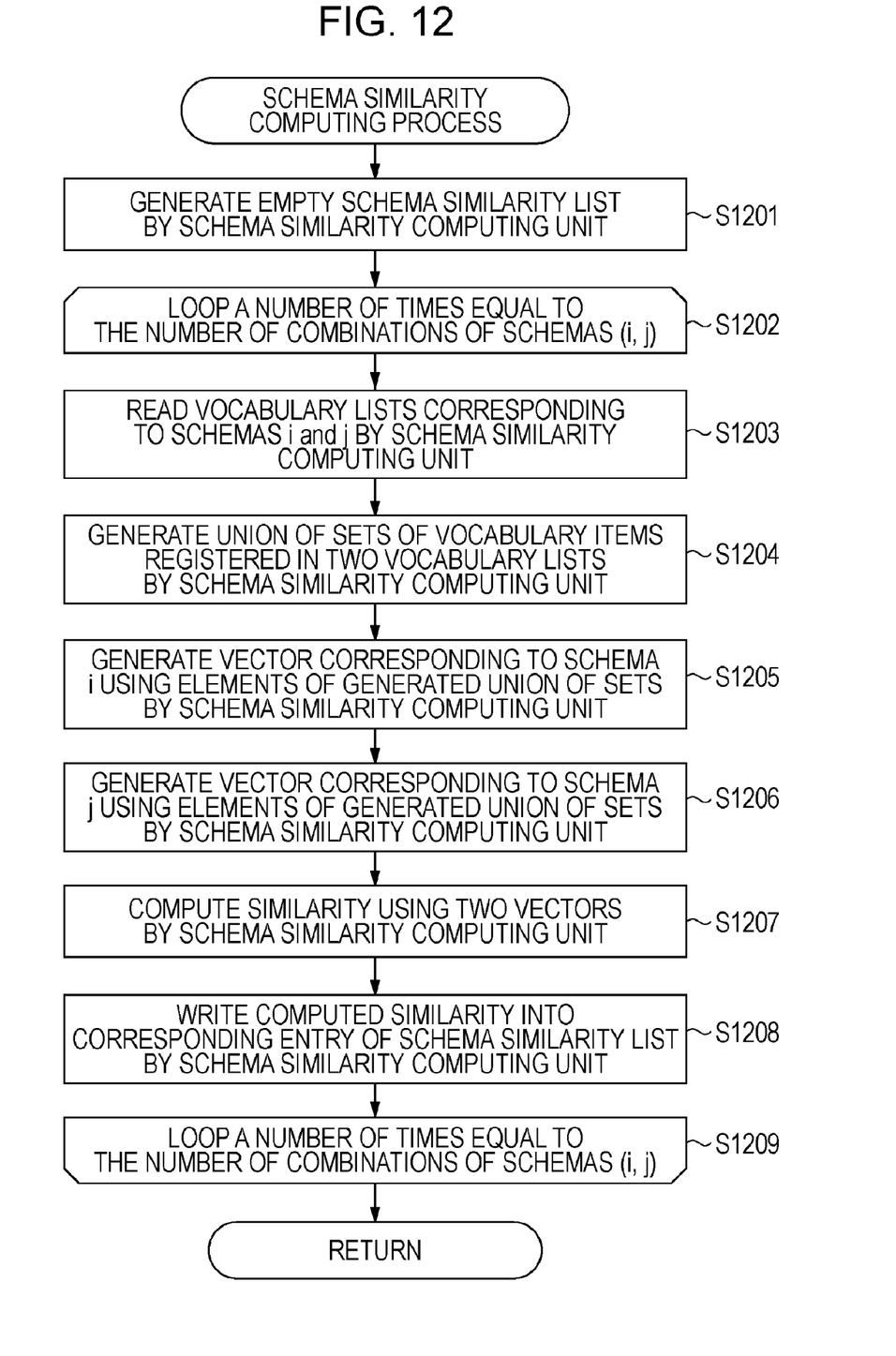
FIG. 12 is a detailed flowchart of a schema similarity list generation process.

FIG. 12 is a detailed flowchart of a schema similarity list generation process (S1304).

Upon receiving a request of generation of a schema similarity list, the schema similarity computing unit 112 (a similarity deriving unit) generates an empty schema similarity list 118 (S1201). Thereafter, the schema similarity computing unit 112 performs the following processing a number of times equal to the number of combinations of the two schemas to be compared. That is, the schema similarity computing unit 112 derives the similarity between the two schema files.

In the present embodiment, a vector space model which is widely used for document searches is applied. In a vector space model, the similarity between schemas is derived by using a cosine value of an angle between vectors.

For example, a function used for deriving a similarity can be expressed as follows:

$$\text{sim}(i, j) = \cos T = (\text{the inner product of } Vi \text{ and } Vj)/(\text{the size of } Vi * \text{the size of } Vj) = (Vi \cdot Vj)/|Vi||Vj|51$$

where
sim(i, j)=the similarity between a schema i and a schema j,
Vi=a vector representing the vocabulary of the schema i,
Vj=a vector representing the vocabulary of the schema j, and
T=an angle formed by Vi and Vj.

The derived value ranges from 0 to 1. The value "0" indicates that the schemas have no similar portions. In contrast, the value "1" indicates that two schemas completely match.

Figure 4A:
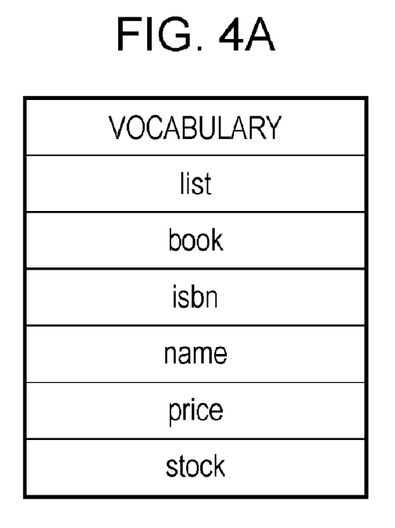
FIGS. 4A to 4D illustrate examples of vocabulary lists for schemas.
Figure 4B:
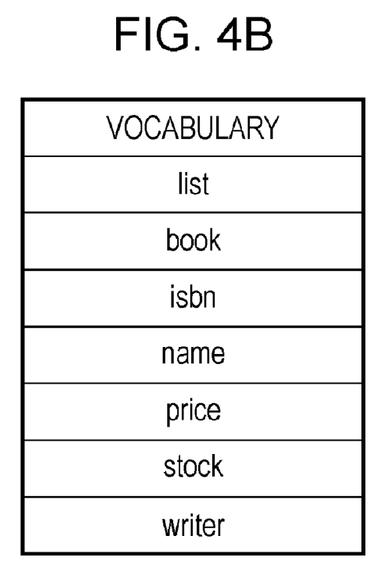
Figure 4C:
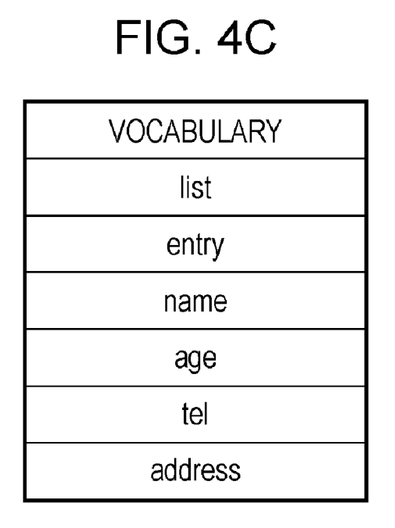
Figure 4D:
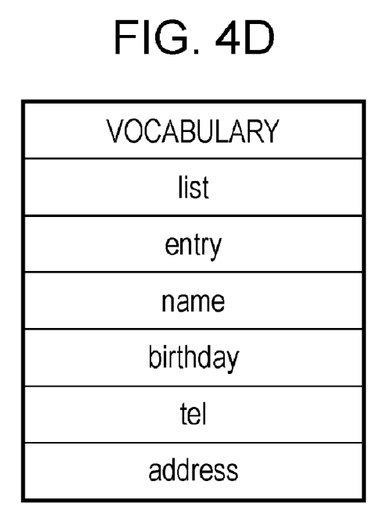

First, the schema similarity computing unit 112 refers to the vocabulary list 117 and generates a sum of sets of vocabulary items of two selected schemas (S1203 and S1204). For example, when the combination of "booklist1.rng" and "booklist2.rng" shown in FIG. 2 is selected, the vocabulary lists 117 of the schemas are shown in FIGS. 4A and 4B, respectively. Accordingly, the union of the sets of vocabulary items is represented as {list, book, isbn, name, price, stock, writer}.

Subsequently, the schema similarity computing unit 112 expresses whether each element in the union of the sets is present in the vocabulary list of each of the schemas using "1" (present) and "0" (not present). These values are used for the elements of a vector (S1205 and S1206).

For example, a vector having the following elements is generated from FIG. 4A:

(1, 1, 1, 1, 1, 1, 0).

Similarly, a vector having the following elements is generated from FIG. 4B:

(1, 1, 1, 1, 1, 1, 1).

In step S1208, the schema similarity computing unit 112 computes the similarity by using the above-described deriving function and registers the computed value in the schema similarity list 118. For example, the similarity between the "booklist1.rng" and the "booklist2.rng" is derived as follows:

$$sim(booklist1.rng, booklist2.rng) = (Vbooklist1.rng \cdot Vbooklist2.rng) / |Vbooklist1.rng||Vbooklist2.rng|$$
$$= (1*1) + (1*1) + (1*1) + (1*1) + (1*1) + (1*1) + (1*0) /$$
$$(1+1+1+1+1+1+0)^{1/2} *$$
$$(1+1+1+1+1+1+1)^{1/2}$$
$$= 6 / (42)^{1/2} = 0.93$$

Similarly, the similarities between another two of the schemas are derived as follows:

sim(booklist1.rng, addresslist1.rng)=0.33,
sim(booklist1.rng, addresslist2.rng)=0.33,
sim(booklist2.rng, addresslist1.rng)=0.31,
sim(booklist2.rng, addresslist2.rng)=0.31, and
sim(addresslist1.rng, addresslist2.rng)=0.71.

Figure 14:
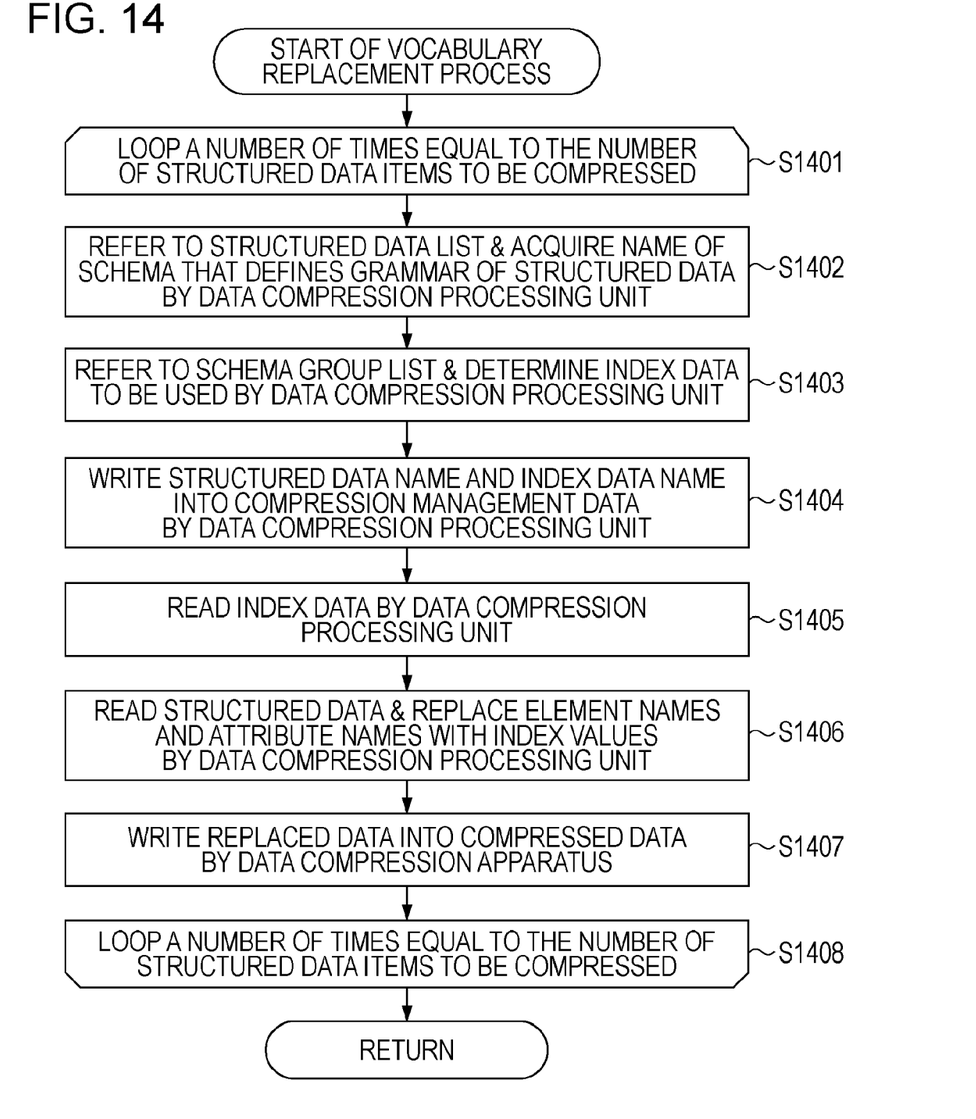
FIG. 14 is a detailed flowchart of a vocabulary item replacement process.

FIG. 14 is a detailed flowchart of a vocabulary item replacement process (S1002).

Upon receiving a request of data compression of the structured data 132, the data compression processing unit 115 performs the following processing for each of the structured data to be compressed.

In step S1402, the data compression processing unit 115 refers to a structured data list 119 and acquires the name of a schema that defines grammar of the structured data.

In addition, in step S1402, the data compression processing unit 115 refers to the schema group list 116 and acquires the group number.

In step S1403, the data compression processing unit 115 determines the index data 133 used for compression. In this example, the file name of the schema index data is represented as: (the group number of the schema group).idx.

Figure 3A:
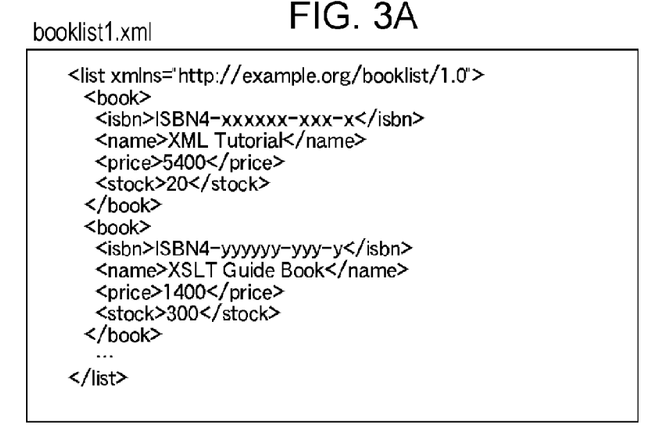
FIGS. 3A to 3D illustrate examples of structured data.

For example, when the structured data "booklist1.xml" shown in FIG. 3A is compressed and the structured data list 119 is referred to, it is found that a schema name "booklist1.rng" is registered in the structured data list 119. In addition, when the schema group list 116 is referred to, it is found that a schema name "booklist1.rng" is registered in the group having a group number of "00000001". Consequently, it is determined that "00000001.idx" is the index data.

In step S1404, the data compression processing unit 115 generates or appends the compressed structured data 134 and the compression management data 135 including the determined index name. In this example, the compressed structured data 134 has a name determined by replacing the file extension of the original name of the structured data 132 with a file extension ".comp".

In step S1406, the data compression processing unit 115 reads the index data 133 and sequentially replaces the element names and the attribute names written in the structured data 132 with the index values written in the index data.

In step S1407, the compressed structured data 134 is generated from the data subjected to the processing performed in step S1406.

For example, when the index data is represented as a file "00000001.idx" and the structured data is represented as a file "booklist1.xml", the compressed structured data 134 generated through the replacement processing has a name "booklist1.comp". The generated file "booklist1.comp" is stored in the storage unit 130.

FIGS. 8A to 8D illustrate examples of the compressed data. The compressed data items shown in FIGS. 8A to 8D are generated by compressing the structured data shown in FIGS. 3A to 3D, respectively. As can be seen from FIGS. 8A to 8D, the vocabulary item in each tag is replaced with an index number, and therefore, the total number of characters (i.e., the data size) is reduced. As described above, in this example, the file extension of the name of the compressed data is changed from "xml" to "comp".

Figure 9:
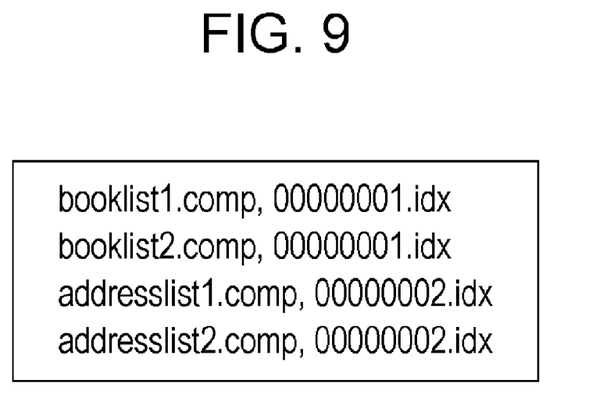
FIG. 9 illustrates an example of compression management data.

FIG. 9 illustrates an example of the compression management data. In this example, the compressed data name and the index data name necessary for the data decompression process are separated by a comma so as to be written in a CSV format. However, any format that can define the correspondence between the compressed data name and the index data name can be used.

Data Decompression Process

The entire procedure of the data decompression process performed by the data decompression apparatus 200 is described next. In the following description, it is assumed that the compressed data 233, the index data 232, and the compression management data 231 are copied into the storage unit 230 of the data decompression apparatus 200. However, these data items may be read from the storage unit 130 of the data compression apparatus 100 via the network cable 300.

Figure 16:
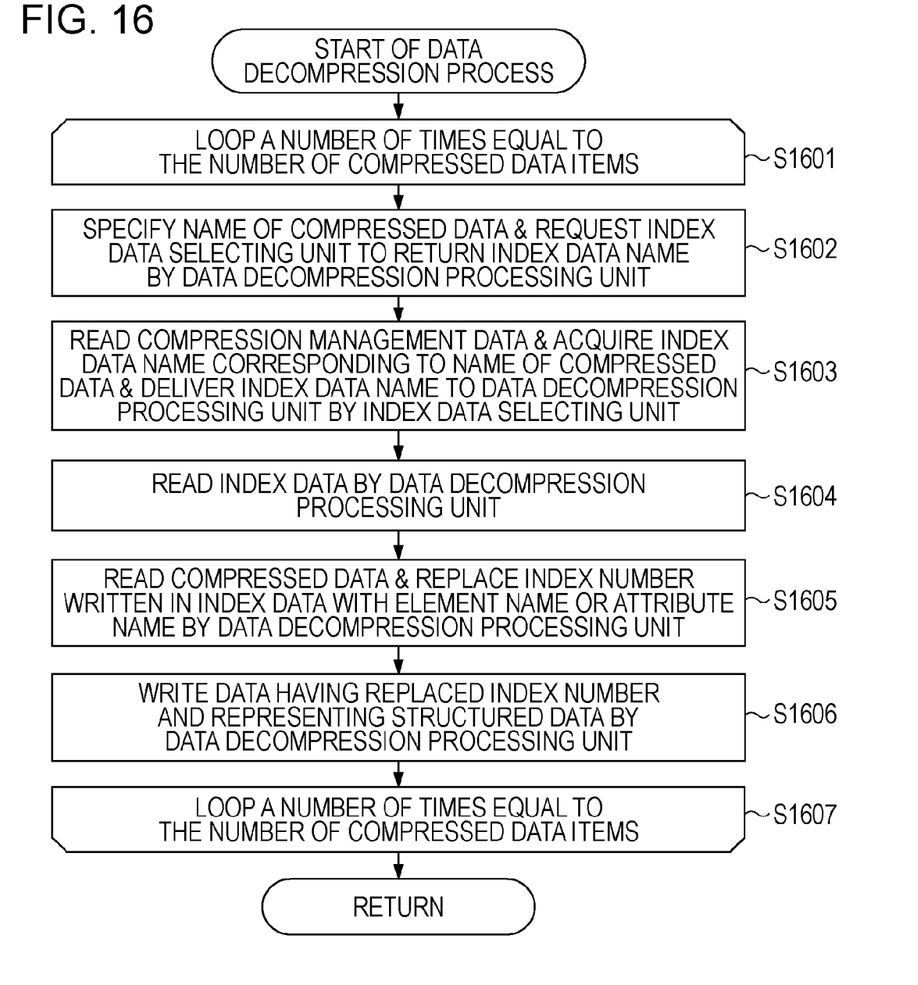
FIG. 16 is a flowchart of a data decompression process performed by a data decompression apparatus.

FIG. 16 is a flowchart of the data decompression process performed by the data decompression apparatus 200.

Upon receiving a request for starting of a data decompression process, the data decompression processing unit 211 of the data decompression apparatus 200 repeatedly performs the following processing for each of the items of the compressed data 233 to be processed.

In step S1602, the data decompression processing unit 211 sends, to the index data selecting unit 212, the name of compressed data to be decompressed and a request for acquiring of the name of the index data corresponding to the name of the compressed data.

In step S1603, the index data selecting unit 212 reads the compression management data 231 so as to acquire the name of the index data corresponding to the name of the compressed data. Thereafter, the index data selecting unit 212 delivers the name of the index data to the data decompression processing unit 211.

Figure 8A:
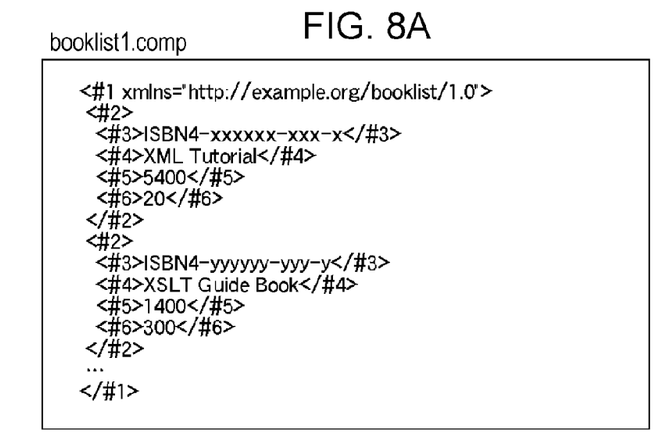
FIGS. 8A to 8D illustrate examples of compressed data.
Figure 8B:
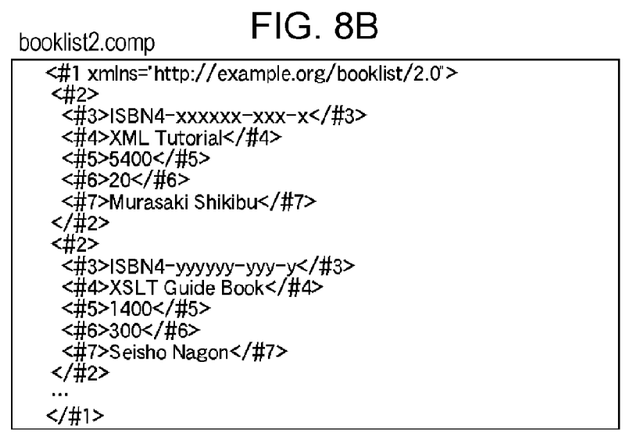
Figure 8C:
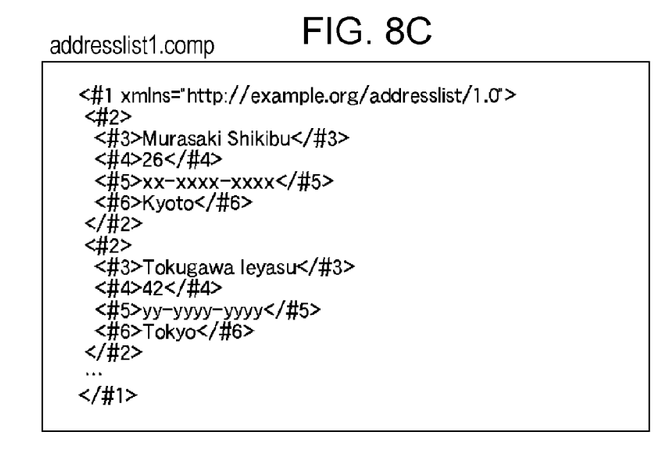
Figure 8D:
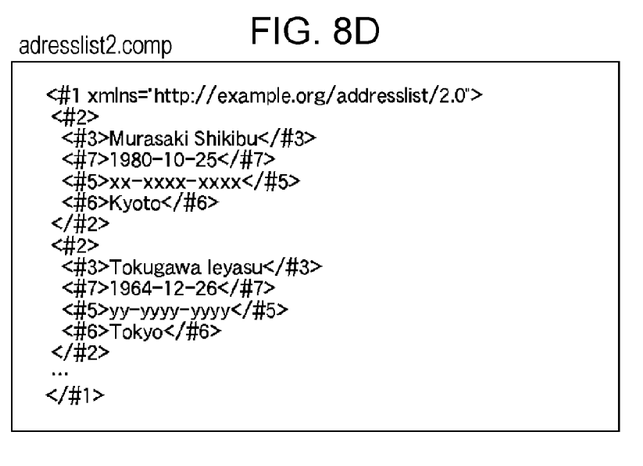

For example, when the compression management data (see FIG. 9) is referred to in order to decompress the compressed data "booklist1.comp" shown in FIG. 8A, the index data name is "00000001.idx".

In step S1604, the data decompression processing unit 211 reads in the index data 232 having the acquired index data name and the compressed data 233.

In step S1605, the index value in the compressed data 233 is sequentially replaced with the vocabulary item (the element name or the attribute name) written in the index data 232.

In step S1606, the structured data 234 is generated from the data subjected to the replacement process performed in step S1605. For example, the index value written in the compressed data "booklist1.comp" shown in FIG. 8A is replaced with a vocabulary item written in the index data "00000001.idx". Thus, the structured data "booklist1.xml" shown in FIG. 3A is reconstructed.

As described above, according to the first embodiment, a single index data item is generated for a plurality of schemas classified into a group using the similarity. Such a configuration reduces the number of conversion tables, and therefore, the amount of memory needed for the conversion tables can be reduced. In particular, this configuration is effective for the case where a plurality of structured data items written in languages having similar vocabularies, such as different versions of the same language, are present.

Accordingly, structured files can be efficiently compressed without installing a large-capacity memory in the data compression apparatus. Thus, this configuration is effective for home appliances and mobile devices that have difficulty providing a large amount of resources.

In addition, acquired compressed data can be easily decompressed and reconstructed into structured data on the basis of the index data.

Modifications

While the first embodiment has been described with reference to the schema similarity list generation process (S1304) in which the similarities between schemas are derived by vectorizing the vocabularies, other methods for deriving the similarity may be employed.

Figure 3B:
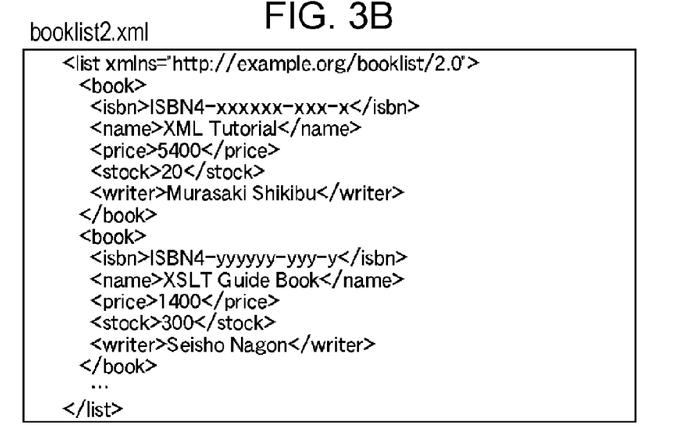
Figure 3C:
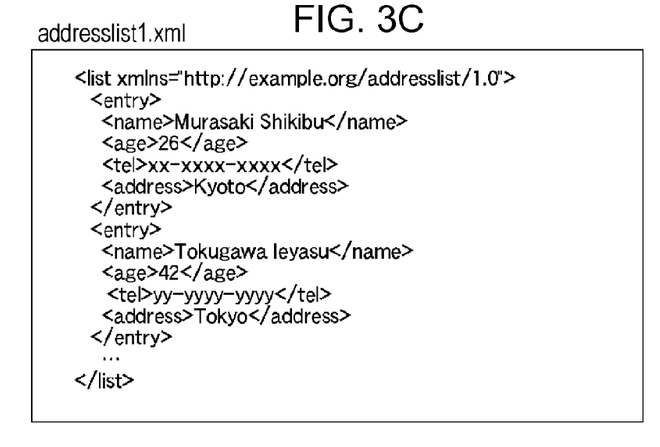
Figure 3D:
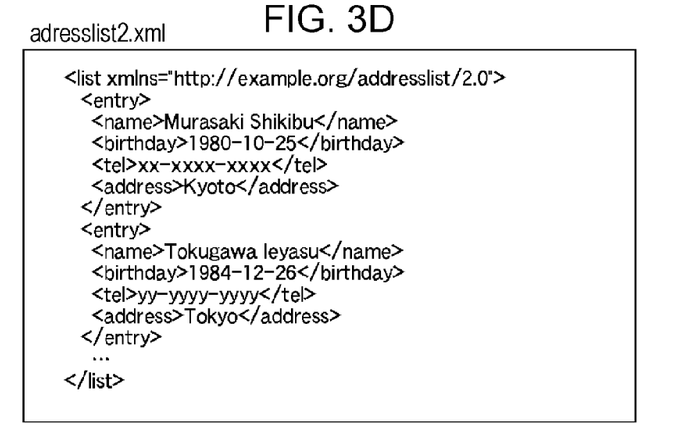

For example, for XML data, a schema to which a vocabulary belongs can be identified using a name space URI definition. For example, the structured data items shown in FIGS. 3A and 3B have the following name space URIs, respectively:

(a) http://example.org/booklist/1.0, and
(b) http://example.org/booklist/2.0.

In this way, by determining the operation rule in which the character string of the name space URI includes the creation date or the version number as a suffix, it can be recognized that a plurality of vocabulary items are shared by the languages of different versions. In such a case, by comparing the character strings of the name space URIs with each other, the computation process of the similarity can be sped up.

For example, the function used for deriving the similarity can be defined as follows:

sim(i, j)
=1 if the character strings other than the name space URI version (substrings) are the same,
=0 if otherwise.

That is, if the substrings are the same, it is determined that the similarity is high.

By using this function, the similarities of the schemas shown in FIGS. 2A to 2D are computed as follows:

sim(booklist1.rng, booklist2.rng)=1,
sim(booklist1.rng, addresslist1.rng)=0,
sim(booklist1.rng, addresslist2.rng)=0,
sim(booklist2.rng, addresslist1.rng)=0,
sim(booklist2.rng, addresslist2.rng)=0, and
sim(addresslist1.rng, addresslist2.rng)=1.

Figure 17:
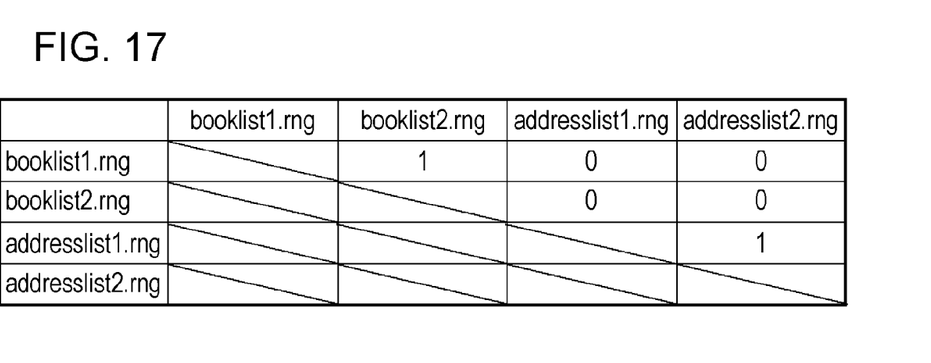
FIG. 17 illustrates a schema similarity list according to a modification of the embodiment of the present invention.

FIG. 17 illustrates a schema similarity list according to this modification.

By configuring the schema similarity list in this manner, the similarities between schemas can be computed at high speed. In this way, classification of a plurality of schemas can be performed at high speed, and therefore, the time needed for the entire compression process can be significantly reduced.

Other Embodiments

While the present invention has been described with reference to an exemplary embodiment, the present invention may be applied to a system including a plurality of apparatuses or a single apparatus.

The present invention can also be achieved by supplying a software program that realizes the function of the above-described exemplary embodiment to a system or an apparatus directly or remotely and by causing a computer of the system or apparatus to read out and execute the software program code. Accordingly, the software program code installed in a computer in order to realize the functional processes of the present invention is also encompassed in the scope of the present invention.

It is further noted that the program code is only required to realize the functions of the above-described embodiment. The format of the program code may be any format. For example, the formats of the program code include object code, program code executed by an interpreter, and a script data supplied to an operating system (OS).

Examples of the recording medium for supplying the program code include a floppy (trade name) disk, a hard disk, an optical disk (a compact disk (CD) or a digital versatile disc (DVD)), a magneto-optical disk, a magnetic tape, a nonvolatile memory card, a read only memory (ROM) or the like.

Furthermore, the functions of the above-described embodiment can be achieved by a computer executing the readout program. The functions of the above-described embodiments can also be achieved by an OS running on the computer and executing some of or all of the functions of the above-described embodiments.

The present invention can also be achieved by writing the program code read out of the storage medium to a memory of an add-on expansion board of a computer or a memory of an add-on expansion unit connected to a computer. The functions of the above-described embodiments can be realized by a process in which, after the program code is written, a CPU in the add-on expansion board or in the add-on expansion unit executes some of or all of the functions in the above-described embodiments under the control of the program code.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-297193 filed Nov. 15, 2007, which is hereby incorporated by reference herein in its entirety.

What is claimed is:

1. A data compression apparatus for compressing structured data, comprising:
   a processor;
   an input unit configured to input a plurality of structured data items to be compressed and a plurality of schema files each corresponding to one of the structured data items;
   a similarity deriving unit configured to derive similarity between at least two schema files among the plurality of input schema files;
   a generating unit configured to use the processor to, in a case where the similarity is equal to or higher than a threshold value, calculate a union of sets of vocabulary items in the at least two schema files and generate one conversion table by associating an index number with each of the vocabulary items from which the union of sets has been calculated, wherein a vocabulary item of the schema file and the index number are associated with each other in the conversion table; and
   a replacement unit configured to replace a vocabulary item of each of the structured data items corresponding to the schema file with a corresponding index number, by using the conversion table and to obtain compressed structured data.

2. The data compression apparatus according to claim 1, wherein the similarity deriving unit generates a list of vocabulary items contained in each of the input schema files and derives the similarity between two schema files among the plurality of schema files on the basis of the list.

3. The data compression apparatus according to claim 1, wherein the similarity deriving unit derives the similarity on the basis of a character string representing a name space defined in each of the schema files.

4. A data decompression apparatus for decompressing compressed structured data subjected to a compression process performed by the data compression apparatus according to claim 1, comprising:
 a processor;
 an input unit configured to input a compressed structured data item to be decompressed;
 an acquiring unit configured to acquire a conversion table generated by the data compression apparatus when the input compressed structured data item was compressed; and
 a replacement unit configured to use the processor to replace an index number contained in the compressed structured data item with a vocabulary item corresponding to the index number on the basis of the conversion table.

5. A method for compressing structured data, comprising:
 inputting a plurality of structured data items to be compressed and a plurality of schema files each corresponding to one of the structured data items;
 deriving similarity between at least two schema files among the plurality of input schema files;
 in a case where the similarity is equal to or higher than a threshold value, calculating a union of sets of vocabulary items in the at least two schema files and generating one conversion table by associating an index number with each of the vocabulary items from which the union of sets has been calculated, wherein a vocabulary item of the schema file and the index number are associated with each other in the conversion table; and
 replacing a vocabulary item of each of the structured data items corresponding to the schema file with a corresponding index number, by using the conversion table, and obtaining compressed structured data.

6. A computer-readable storage medium storing a program for causing a computer to execute a method comprising:
 inputting a plurality of structured data items to be compressed and a plurality of schema files each corresponding to one of the structured data items;
 deriving similarity between at least two schema files among the plurality of input schema files;
 in a case where the similarity is equal to or higher than a threshold value, calculating a union of sets of vocabulary items in the at least two schema files and generating one conversion table by associating an index number with each of the vocabulary items from which the union of sets has been calculated, wherein a vocabulary item of the schema file and the index number are associated with each other in the conversion table; and
 replacing a vocabulary item of each of the structured data items corresponding to the schema file with a corresponding index number, by using the conversion table, and obtaining compressed structured data.

7. A data compression apparatus for compressing structured data, comprising:
 a processor;
 an input means for inputting a plurality of structured data items to be compressed and a plurality of schema files each corresponding to one of the structured data items;
 a similarity deriving means for deriving similarity between at least two schema files among the plurality of input schema files;
 a generating means for, in a case where the similarity is equal to or higher than a threshold value, calculating a union of sets of vocabulary items in the at least two schema files and generating one conversion table by associating an index number with each of the vocabulary items from which the union of sets has been calculated, wherein a vocabulary item of the schema file and the index number are associated with each other in the conversion table; and
 a replacement means configured to use the processor to replace a vocabulary item of each of the structured data items corresponding to the schema file with a corresponding index number, by using the conversion table, and to obtain compressed structured data.

* * * * *